(12) United States Patent
Nam

(10) Patent No.: US 6,542,425 B2
(45) Date of Patent: *Apr. 1, 2003

(54) REFRESH CONTROL CIRCUIT FOR CONTROLLING REFRESH CYCLES ACCORDING TO VALUES STORED IN A REGISTER AND RELATED REFRESHING METHOD

(75) Inventor: Kyung-woo Nam, Seoul (KR)

(73) Assignee: Samsung Electronics Co., Ltd., Suwon (KR)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/558,321

(22) Filed: Apr. 26, 2000

(65) Prior Publication Data

US 2002/0085441 A1 Jul. 4, 2002

(30) Foreign Application Priority Data

Jun. 1, 1999 (KR) .............................. 99-19984

(51) Int. Cl.[7] .................................................. G11C 7/00
(52) U.S. Cl. ................... 365/222; 365/230.06; 365/236
(58) Field of Search ................................ 365/222, 236, 365/189.05, 230.06, 230.08, 233, 189.07

(56) References Cited

U.S. PATENT DOCUMENTS

| | | | | |
|---|---|---|---|---|
| 4,563,748 A | * | 1/1986 | Hanaoka | 702/133 |
| 5,243,576 A | * | 9/1993 | Ishikawa | 365/222 |
| 5,268,865 A | * | 12/1993 | Takasugi | 365/189.05 |
| 5,337,282 A | * | 8/1994 | Koike | 365/222 |
| 5,495,452 A | * | 2/1996 | Cha | 365/222 |
| 5,594,699 A | * | 1/1997 | Nomura et al. | 365/226 |
| 5,870,333 A | * | 2/1999 | Matsumoto | 365/185.2 |
| 5,969,981 A | * | 10/1999 | Kono | 365/145 |

FOREIGN PATENT DOCUMENTS

| | | |
|---|---|---|
| JP | 5-74154 | 3/1993 |
| JP | 7-244984 | 9/1995 |

* cited by examiner

*Primary Examiner*—David Nelms
*Assistant Examiner*—Gene N. Auduong
(74) *Attorney, Agent, or Firm*—Volentine Francos, PLLC

(57) ABSTRACT

A refresh control circuit is provided for controlling refresh cycles according to values stored in a register. A related refreshing method is also provided. The refresh control circuit controls the refresh cycles so as to refresh data stored in memory cells. The refresh control circuit includes a refresh counter for generating a plurality of frequency division signals by dividing a clock signal in response to a refresh signal for directing a refresh operation. The refresh control circuit also includes a refresh activation signal generator for generating a refresh activation signal corresponding to the refresh cycle according to values stored in a register.

18 Claims, 4 Drawing Sheets

REFRESH CONTROL CIRCUIT FOR CONTROLLING REFRESH CYCLES ACCORDING TO VALUES STORED IN A REGISTER AND RELATED REFRESHING METHOD

This application relies for priority upon Korean Patent Application No. 99-19984, filed on Jun. 1, 1999, the contents of which are herein incorporated by reference in their entirety.

BACKGROUND OF THE INVENTION

The present invention relates to a semiconductor memory device. More particularly, the present invention relates to a refresh control circuit for controlling a refresh cycle that performs the refresh of memory cell data and to a related refreshing method.

Semiconductor memory devices can be generally divided into two groups; dynamic RAM (DRAM) devices and static RAM (SRAM) devices. In an SRAM, a memory cell is often realized by four transistors that constitute a latch. Stored data of such a memory cell is preserved without being damaged unless the power supply is removed. As a result, an SRAM does not require a refresh operation for re-charging the memory cell data during its use.

In contrast, in a DRAM, a memory cell is often made of a single transistor and a single capacitor, with the memory cell data being stored in the capacitor. Since the capacitor is fabricated on a semiconductor substrate and is not completely electrically isolated from its surroundings, leakage current may occur around the capacitor, thus damaging the data stored in the capacitor of the memory cell. As a result, a refresh operation is necessary in a DRAM to periodically re-charge the data in the memory cell.

Such a refresh operation is generally performed according to the following process. Initially, one or more word lines are sequentially selected. The data stored in the capacitors of the memory cells coupled to the selected word lines are amplified by a sense amplifier and are then restored once more to their respective storage capacitors.

The stored data in the memory cells are thus preserved without being damaged through this refresh process. To continually preserve the stored data, the refresh process must be performed at predetermined intervals referred to as refresh cycles.

A conventional refresh cycle is designated by refresh requests from an external processor. The timing of the refresh cycle is determined by a counter included in an oscillator. The counter generates division signals having division rates that are power of two multiples, i.e., ×2, ×4, ×8, ×16, . . . , of a clock cycle by dividing the clock signals of the oscillator.

The refresh cycle is then determined by selecting one of the division signals depending upon the characteristic of a DRAM cell and a chip architecture. For example, assume that the refresh is performed in a refresh cycle of 8λ with respect to the clock cycle λ of the oscillator. If the length of the refresh cycle must be increased based upon the characteristic of the DRAM cell, the refresh cycle will be changed to 16λ. When the length of a refresh cycle must be increased, only 16λ, which is a multiple of 8λ, can be selected since it is not possible to select a refresh cycle between 8λ and 16λ.

Therefore, a more flexible refresh control circuit would be desirable. Such a circuit would make it possible to finely control a change in the refresh cycle so as to select a cycle of any number, i.e., ×1, ×2, ×3, ×4, . . . , rather than a cycle which is a power of two multiple, i.e., ×2, ×4, ×8, ×16, . . . , of the clock cycle of the oscillator in selecting the refresh cycles.

SUMMARY OF THE INVENTION

To solve the above problem, it is an object of the present invention to provide a counter circuit capable of controlling division rates with respect to a clock signal and a refresh control circuit to control a change in refresh cycles by employing the counter circuit.

It is another object of the present invention to provide a refreshing method of such a refresh control circuit.

Accordingly, to achieve the first object, a counter circuit is provided for receiving a clock signal and generating a counter signal having a predetermined division rate with respect to the clock signal. The counter circuit comprises a divider for dividing the clock signal and generating a plurality of division signals, a register for selecting the division rate, and a counter signal generator for receiving the division signals and generating the counter signal when one of the division signals matches a division value stored in the register. The division value preferably indicates the division rate.

The register preferably comprises a plurality of fuses, and the division rate is determined by detecting whether the fuses are on or off.

The counter circuit further may comprise a counter reset circuit for suppressing the operation of the divider and initializing the operation of the divider.

The division signals preferably correspond to integral multiples of the clock signal, and more preferably correspond to times-two multiples of the clock signal.

A refresh control circuit is also provided for controlling refresh cycles so as to refresh data stored in memory cells. The refresh control circuit comprises a refresh counter for generating a plurality of frequency division signals by dividing a clock signal in response to a refresh signal for directing a refresh operation, and a refresh activation signal generator for generating a refresh activation signal corresponding to the refresh cycle according to values stored in a register.

The refresh activation signal generator may further comprise a plurality of fuses formed in the register, the values stored in the register being determined by detecting whether the fuses are on or off.

The refresh activation signal is preferably generated while the frequency division signals are equal to values stored in the register.

The frequency division signals preferably correspond to integral multiples of the clock signal, and more preferably correspond to times-two multiples of the clock signal.

The refresh circuit may further comprise a refresh resetting unit for suppressing the operation of the refresh counter and initializing the refresh counter.

To achieve the second object, a method is provided for refreshing data stored in memory cells. The method comprises (a) generating a refresh signal for directing the refresh operation, (b) activating a refresh counter for generating a plurality of frequency division signals having predetermined division rates with respect to a clock signal in response to the refresh signal, (c) generating a refresh activation signal while the frequency division signals are equal to division values stored in a register, and (d) initializing the refresh counter by generating a refresh reset signal having a predetermined pulse width in response to the refresh activation signal. The refresh operation is performed by a refresh activation signal having a refresh cycle by repeating steps (a) through (d).

The division values stored in the register are preferably determined by detecting whether each of a plurality of fuses in the register are on or off.

According to the present invention, there are a wider variety of refresh cycles available, since the refresh cycle is determined by the values stored in the register.

BRIEF DESCRIPTION OF THE DRAWINGS

The above objects and advantages of the present invention will become more apparent describing in detail a preferred embodiment thereof with reference to the attached drawings in which.

DESCRIPTION OF THE PREFERRED EMBODIMENTS

Figure 1:
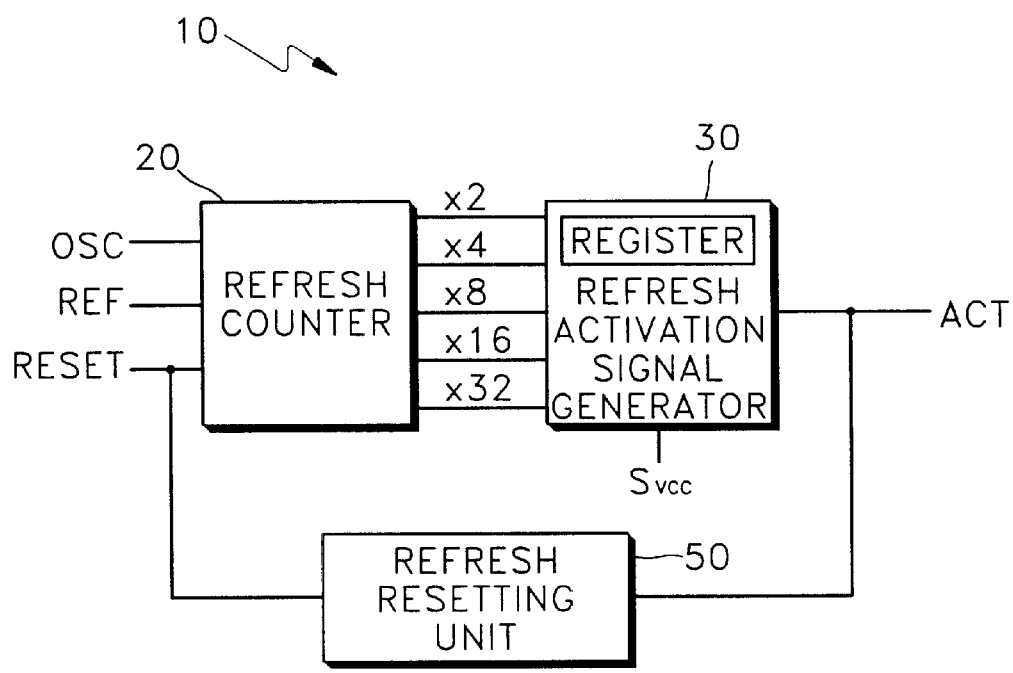
FIG. 1 shows a refresh control circuit according to a preferred embodiment of the present invention.

The present invention now will be described more fully with reference to the accompanying drawings, in which an exemplary embodiment of the invention is shown. In the drawings, the same reference numerals in different drawings represent the same element.

In this specification, a description of a DRAM is provided. This DRAM contains memory blocks constituted of a plurality of memory cells arranged in rows and columns and a refresh control circuit. The refresh control circuit determines a refresh cycle and performs a refresh operation.

FIG. 1 shows a refresh control circuit according to a preferred embodiment of the present invention. Referring to FIG. 1, a refresh control circuit 10 includes a refresh counter 20, a refresh activation signal generator 30, and a refresh resetting unit 50.

The refresh counter 20 receives a clock signal OSC generated by an oscillator (not shown) built into a DRAM. The refresh counter 20 then divides the clock signal OSC in response to a refresh signal REF, which indicates a refresh operation, and generates a plurality of division signals ×2, ×4, ×8, ×16, and ×32. Preferably, the oscillator (not shown) periodically generates the clock signal OSC using a feedback methodology that can be easily realized by anyone skilled in the art. As a result, a detailed description of the structure and operation of the oscillator will be omitted in the present specification.

The clock signal OSC may also be an external clock signal provided from the outside of the DRAM, rather than being provided by an oscillator (not shown) built into the DRAM. The number of division signals ×2, ×4, ×8, ×16, and ×32 can also vary. However, in the present embodiment, an example using five division signals ×2, ×4, ×8, ×16, and ×32 will be described for ease of explanation.

Figure 2:
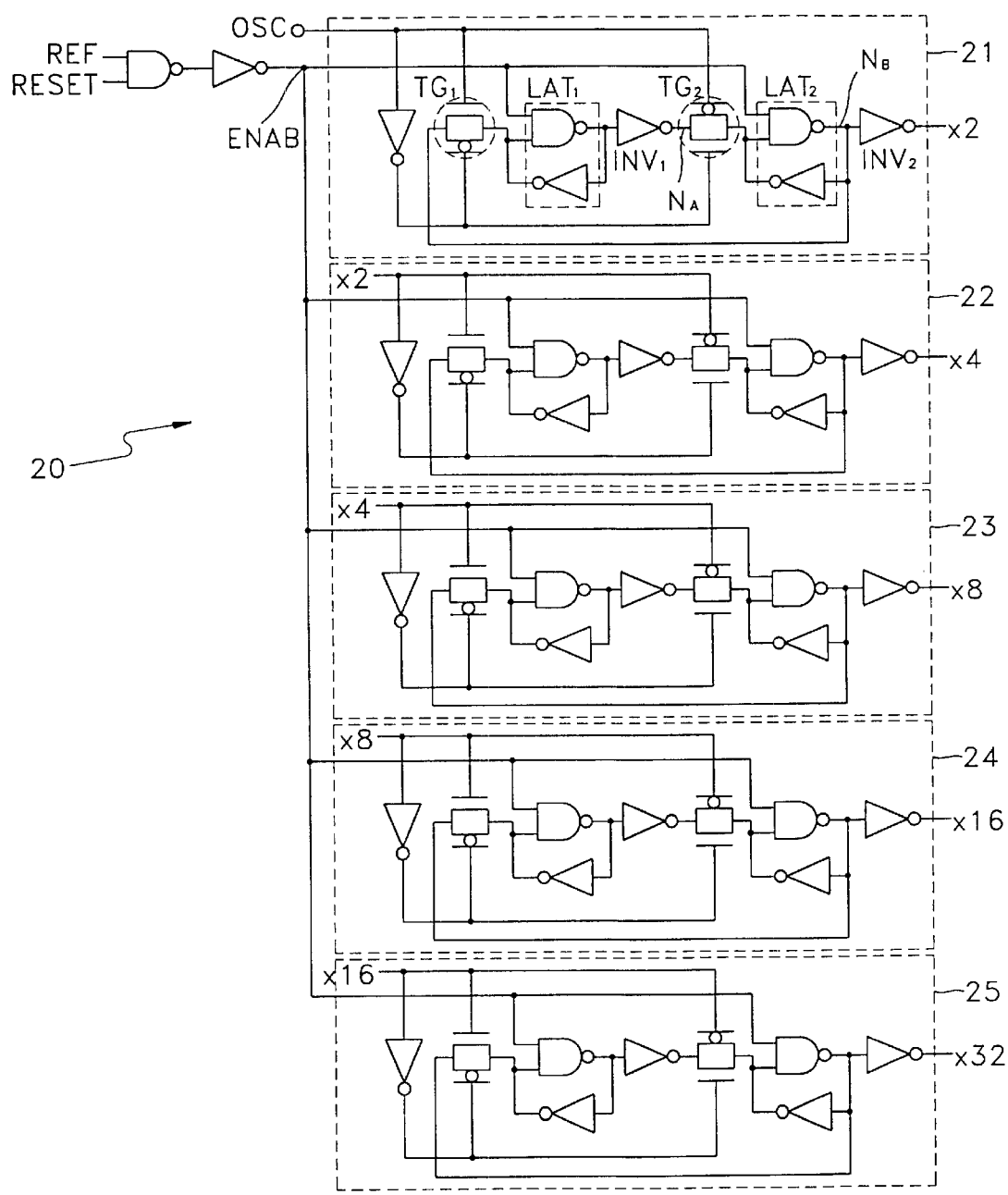
FIG. 2 shows the refresh counter of FIG. 1.

FIG. 2 shows the refresh counter 20 of FIG. 1 in detail. Referring to FIG. 2, the refresh counter 20 includes a plurality of dividers 21, 22, 23, 24, and 25 for dividing the clock signal OSC in response to a refresh enable signal ENAB, which is generated in response to a refresh reset signal RESET and a refresh signal REF. The refresh reset signal RESET suppresses or activates the operation of the refresh counter 20. The refresh enable signal ENAB rises to a logic high level in response to a logic high refresh reset signal RESET for activating the refresh counter 20 and a logic high refresh signal REF for directing the refresh operation. When the refresh enable signal ENAB rises to a logic high level, it enables the operation of the plurality of dividers 21, 22, 23, 24, and 25.

The dividers 21, 22, 23, 24, and 25 include a ½ frequency divider 21, a ¼ frequency divider 22, a ⅛ frequency divider 23, a 1/16 frequency divider 24, and a 1/32 frequency divider 25, respectively.

The ½ frequency divider 21 is activated when the refresh enable signal ENAB is at the logic high level, and generates a ½ frequency division signal ×2, whose cycle is double the cycle of the clock signal OSC. The operation of the ½ frequency divider 21 is as follows.

When the refresh enable signal ENAB is at a logic high level, a first transmission gate $TG_1$ is turned-on in response to the rising edge of the clock signal OSC. At this time, the logic level of a node $N_B$, e.g., a logic high level, is transmitted to a node $N_A$ through a first latch $LAT_1$ and a first invertor $INV_1$. In addition, a second transmission gate $TG_2$ is turned-on in response to the falling edge of the clock signal OSC causing the logic level of the node $N_B$ to fall to a logic low level. At this time, the first transmission gate $TG_1$ is turned-off and the logic low level of the node $N_B$ is not transmitted to the node $N_A$. Therefore, the node $N_A$ rises to the logic high level of the node $N_B$ at the rising edge of the clock signal OSC. The logic high level of the node $N_B$ is then inverted into the logic low level at the falling edge of the clock signal OSC. Finally, the ½ frequency division signal ×2 becomes a logic high level through a second inverter $INV_2$.

The logic low level of the node $N_B$ is also transmitted to the first transmission gate $TG_1$. The node $N_A$ then drops to a logic low level at the rising edge of the clock signal OSC and the node $N_B$ rises to a logic high level at the falling edge of the clock signal OSC. The ½ frequency division signal ×2 becomes a logic low level, and as a result, one cycle of the ½ frequency division signal ×2 is realized. AS a result of this operation, the ½ frequency division signal ×2 is repeatedly cycled every falling edge of the clock signal OSC and so one cycle of the ½ frequency division signal ×2 is equal to 2 cycles of the clock signal OSC.

The ¼ frequency divider 22 is activated by the logic high level of the refresh enable signal ENAB and generates a ¼ frequency division signal ×4, one cycle of which is equal to 2 cycles of the ½ frequency division signal ×2. The operation of the ¼ frequency divider 22 is different from the operation of the ½ frequency divider 21 only in that the ½ frequency division signal ×2 is used as an input instead of the clock signal OSC. Therefore, a description of the operation of the ¼ frequency divider 22 will be omitted. The ¼ frequency divider 22 is repeatedly cycled every falling edge of the ½ frequency division signal ×2 and so 4 cycles of the ¼ frequency division signal ×4 are equal to one cycle of the clock signal OSC.

The ⅛ frequency divider 23, the 1/16 frequency divider 24, and the 1/32 frequency divider 25 operate in a manner similar to that of the ¼ frequency divider 22, differing only in their input signal. Thus, the only difference between the operations of the ⅛ frequency divider 23, the 1/16 frequency divider 24, and the 1/32 frequency divider 25 and the operation of the ¼ frequency divider 22 is in the length of their cycles, and so a description of the operations of the ⅛ frequency divider 23, the ¹⁄₁₆ frequency divider 24, and the ¹⁄₃₂ frequency divider 25 will also be omitted.

Referring to FIG. 1, the refresh counter 20 receives the clock signal OSC from an oscillator (not shown) inside the DRAM or from the outside of the DRAM. The refresh counter 20 then divides the clock signal OSC in response to the refresh signal REF for directing the refresh operation and generates a plurality of frequency division signals ×2, ×4, ×8, ×16, and ×32. The plurality of frequency division signals ×2, ×4, ×8, ×16, and ×32 are input to the refresh activation signal generator 30, which in turn generates a refresh activation signal ACT for performing the refresh operation.

Figure 3:
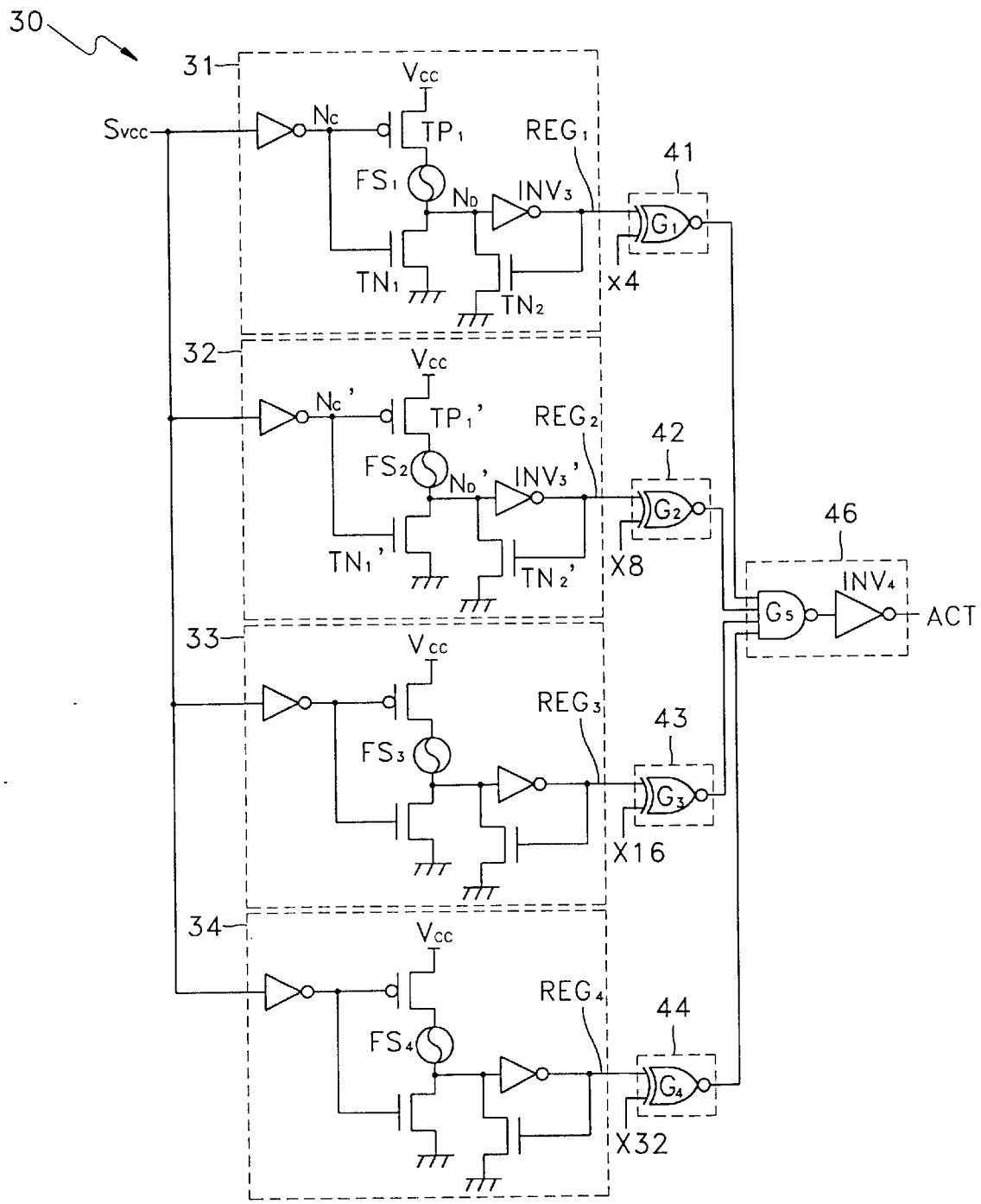
FIG. 3 shows the refresh activation signal generator of FIG. 1.

FIG. 3 shows the refresh activation signal generator 30 of FIG. 1. Referring to FIG. 3, the refresh activation signal generator 30 includes a plurality of registers 31, 32, 33, and 34 and generates the refresh activation signal ACT having a predetermined refresh cycle in response to the values stored in the registers 31, 32, 33, and 34. Although the number of registers 31, 32, 33, and 34 can vary, in the present invention, an example using four registers 31, 32, 33, and 34 will be described for ease of explanation.

The refresh activation signal generator 30 includes the plurality of registers 31, 32, 33, and 34, a plurality of comparators 41, 42, 43, and 44, and a gate circuit 46. The comparators 41, 42, 43, and 44 compare the values stored in the registers 31, 32, 33, and 34 with the frequency division signals ×2, ×4, ×8, ×16, and ×32, respectively. The gate circuit 46 combines the output values of the comparators 41, 42, 43, and 44.

The registers 31, 32, 33, and 34 each have a respective fuse $FS_i$ (where i=1 through 4) and operate to store a predetermined value according to a state of the respective fuse $FS_i$, i.e., whether the fuses are cut off or not, in response to a power-up signal $S_{VCC}$. The power-up signal $S_{VCC}$ is preferably at a logic low level before a power supply voltage $V_{CC}$ reaches a constant voltage level, e.g., 5V, and rises to a logic high level when the power supply voltage $V_{CC}$ reaches its constant voltage level.

For example, assuming that the values stored in the first through fourth registers 31, 32, 33, and 34 are "0," "1," "1," and "0," respectively, i.e., 0110, the first and fourth fuses $FS_1$ and $FS_4$ in the first and fourth registers 31 and 34 are not cut off and the second and third fuses $FS_2$ and $FS_3$ in the second and third registers 32 and 33 are cut off The operation of storing a logic "0" in the first register 31 will be described as follows. Initially, the first fuse $FS_1$ is not cut off. At an initial stage of the power-up, in the first register 31, a third node $N_C$ rises to a logic high level in response to the logic low level of the initial power-up signal $S_{VCC}$; a transistor $TN_1$ is turned-on in response to the logic high level of the third node $N_C$; and a node $N_D$ falls to a logic low level. The logic low level of the third node $N_D$ then generates a logic high level having the first register value $REG_1$ through a third invertor $INV_3$. The logic high level of first register value $REG_1$ is then fed back through a turned-on transistor $TN_2$ and the third invertor $INV_3$. Thus, the logic low level of the node $N_D$ and the logic high level of the first register value $REG_1$ are maintained.

Also, at the latter stage of the power-up, the third node $N_C$ drops to a logic low level in response to the logic high level of the latter power-up signal $S_{VCC}$; a transistor $TP_1$ is then turned-on in response to the logic low level of third node $N_C$; and the node $N_D$ rises to a logic high level through the transistor $TP_1$ and the first fuse $FS_1$. The logic high level of the node $N_D$ generates a logic low level of the first register value $REG_1$ through the inverter $INV_3$. Therefore, the first register value $REG_1$ stored in the first register 31 is "0".

The operation of storing "1" in the second register 32 will be described as follows. First, the second fuse $FS_2$ is cut off before the power supply voltage $V_{CC}$ is applied. At the initial stage of the power-up, the node $N_C'$ is at a logic high level, the node $N_D'$ is at a logic low level, and the second register value $REG_2$ is at a logic high level. At the latter stage of the power-up, the node $N_C'$ drops to a logic low level in response to the logic high level of the latter power-up signal $S_{VCC}$ and the transistor $TP_1'$ is turned-on in response to the logic low level of node $N_C'$. However, since the second fuse $FS_2$ is cut off, the power supply voltage $V_{CC}$ is not connected to the node $N_C'$, and so the node $N_D'$ is maintained at its previous logic low level, i.e., its logic level at the initial stage of the power-up. The logic high level of the second register value $REG_2$ is also maintained through a turned-on transistor $TN_2'$ and the invertor $INV_3'$. Therefore, the second register value $REG_2$ stored in the second register 32 is "1."

Since the operation of storing a "1" in a third register 33 is the same as the operation of storing a "1" in the second register 32 and the operation of storing a "0" in a fourth register 34 is the same as the operation of storing a "0" in the first register 32, a description of the operation of the registers 33 and 34 will be omitted.

Therefore, as set forth above, the first through fourth registers 31, 32, 33, and 34 together store the value 0110 of the first through fourth register values $REG_i$ (where i=1 through 4) according to the state of the fuses $FS_i$ (where i=1 through 4), i.e., whether the fuses are cut off or not, in response to the logic high level of the latter power-up signal $S_{VCC}$.

The register values $REG_i$ (where i=1 through 4) may be set by the mode register set (MDS) instead of the fuses in the first through fourth registers 31, 32, 33, and 34. The MDS provides a mechanism for customizing the behavior of the SDRAMS and can easily be realized by someone skilled in the art.

After this, the first through fourth register values $REG_i$ (where i=1 through 4) are input to the comparators 41, 42, 43, and 44 and are compared with the frequency division signals ×2, ×4, ×8, ×16, and ×32, respectively. The comparators 41, 42, 43, and 44 preferably include exclusive OR gates $G_1$, $G_2$, $G_3$, and $G_4$.

The first comparator 41 generates a logic high level of the output of exclusive OR gate $G_1$ when the logic level of the periodically generated ¼ frequency division signal ×4 is equal to the first register value $REG_1$, i.e., "0," and generates a logic low level during any other period. The second comparator 42 generates a logic high level of the output of exclusive OR gate $G_2$ when the logic level of the periodically generated ⅛ frequency division signal ×8 is equal to the second register value $REG_2$, i.e., "1," and generates a logic low level during any other period. The third comparator 43 generates a logic high level of the output of exclusive OR gate $G_3$ when the logic level of the periodically generated ¹⁄₁₆ frequency division signal 16 is equal to the third register value $REG_3$, i.e., "1," and generates a logic low level during any other period. The fourth comparator 44 generates a logic high level of the output of exclusive OR gate $G_4$ when the logic level of the periodically generated ¹⁄₃₂ frequency division signal 32 is equal to the fourth register value $REG_4$, i.e., "0," and generates a logic low level during any other period.

The outputs of the exclusive OR gates $G_i$ (where i=1 through 4) are input to a gate circuit unit 46 and generate a refresh activation signal ACT that is used to perform a refresh operation. In the gate circuit unit 46, the output of 4-input NAND gate $G_5$ is at a logic low level when the ¼ frequency division signal 4 is equal to $REG_1$, i.e., "0," the ⅛ frequency division signal 8 is equal to $REG_2$, i.e., "1," the ¹⁄₁₆ frequency division signal 16 is equal to $REG_3$, i.e., "1," and the ¹⁄₃₂ frequency division signal 32 is equal to $REG_4$, "0," among the outputs of the comparators 41,42,43, and 44. The logic low level of the output of 4-input NAND gate $G_5$ then generates a logic high level of the refresh activation signal ACT through an invertor $INV_4$. The logic high level of the refresh activation signal ACT performs the refresh operation.

In contrast, when the frequency division signals ×4, ×8, ×16, and ×32 corresponding to the registers 31, 32, 33, and 34 are not equal to the first through fourth register values 0110, respectively, the gate circuit unit 46 generates the refresh activation signal ACT at a logic low level, which stops the refresh operation.

Figure 4:
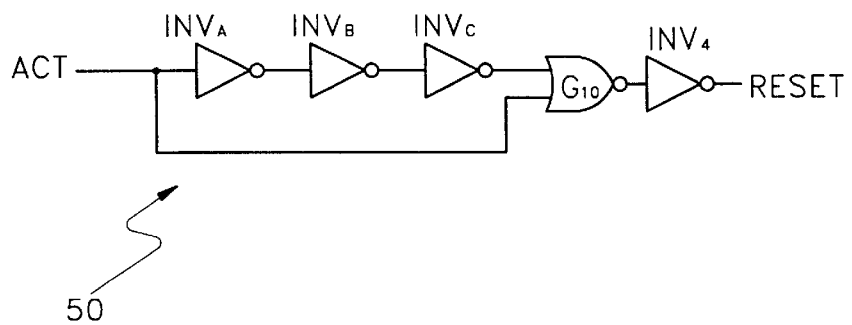
FIG. 4 shows the refresh resetting unit of FIG. 1.

Returning to FIG. 1, the refresh activation signal ACT is input to the refresh resetting unit 50 and generates a refresh reset signal REF to reset the refresh counter 20. FIG. 4 shows the refresh resetting unit 50.

Referring to FIG. 4, the refresh resetting unit 50 includes three serially connected invertors $INV_A$, $INV_B$, and $INV_C$, a NOR gate $G_{10}$, and an invertor $INV_4$. The three serially connected invertors $INV_A$, $INV_B$, and $INV_C$ receive the refresh activation signal ACT is an input. The NOR gate $G_{10}$ receives the output of the invertor $INV_C$ and the refresh activation signal ACT as its input signals. The invertor $INV_4$ receives as its input the output of the NOR gate $G_{10}$ and generates the refresh reset signal RESET.

When the refresh activation signal ACT is transited from a logic high level to a logic low level, the logic low level of the refresh activation signal ACT is connected directly to one input of the NOR gate $G_{10}$ and the logic high level of the output of the invertor $INV_C$ is connected to the other input of the NOR gate $G_{10}$. The logic high level of the invertor $INV_C$, passing through the three invertors $INV_A$, $INV_B$, and $INV_C$, is delayed. The output of the NOR gate $G_{10}$ is at the logic high level having a pulse width defined by the delay time between the logic low level of the refresh activation signal ACT and the logic high level of the invertor $INV_C$.

The refresh reset signal RESET has the same pulse width and becomes a logic low level by passing through the inverter $INV_4$. The logic low level of the refresh reset signal RESET is input to the refresh counter 20 of FIG. 2 and deactivates the refresh enable signal ENAB to the logic low level. This stops the operation of the frequency dividers 21, 22, 23, 24, and 25 and then initializes the refresh counter 20.

Figure 5:
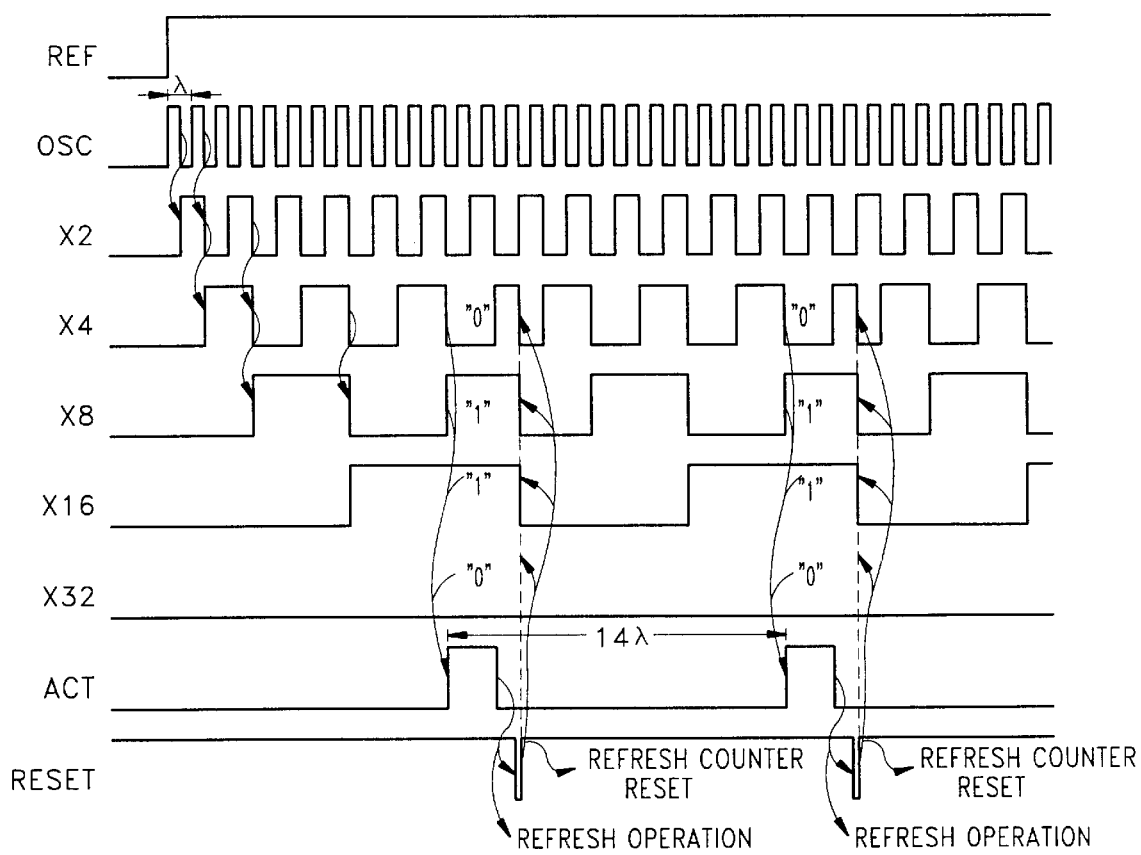
FIG. 5 is a timing diagram showing an operation of the refresh control circuit of FIG. 1.

FIG. 5 is a timing diagram showing the operation of the refresh control circuit of FIG. 1. Referring to FIG. 5, the clock signal OSC, whose cycle is λ from the oscillator (not shown), is input to the refresh control circuit 10 of FIG. 1. The clock signal OSC is input during a logic high level of the refresh signal REF for directing the refresh operation and a logic high level of the refresh reset signal RESET. The plurality of frequency dividers 21, 22, 23, 24, and 25 in the refresh counter 20 are then activated and generate the frequency division signals ×2, ×4, ×8, ×16, and ×32. The refresh activation signal ACT is then generated to be a logic high level while the frequency division signals ×4, ×8, ×16 and ×32 corresponding to the registers 31, 32, 33, and 34 are equal to the stored register values, respectively, i.e., 0110 in this example.

Next, when a transition of the refresh activation signal ACT from the logic high level to a logic low level occurs, the refresh reset signal is generated to be at a logic low level and to have a predetermined pulse width. The logic low level of the refresh reset signal RESET stops the operations of the frequency dividers 21, 22, 23, 24, and 25 of FIG. 2 and initializes the refresh counter 20 of FIG. 2.

In the refresh control circuit 10 of FIG. 1, the plurality of dividers 21, 22, 23, 24, and 25 in the refresh counter 20 of FIG. 2 are continuously activated and generate the frequency division signals ×2, ×4, ×8, ×16, and ×32. The refresh activation signal ACT is generated to be a logic high level while the frequency division signals ×4, ×8, ×16 and ×32 corresponding to the registers 31, 32, 33, and 34 of FIG. 3 are equal to the stored register values, respectively, i.e., 0110 in this example.

In this disclosed embodiment, by repeatedly performing the above operation, the refresh activation signal ACT has a 14λ cycle with respect to the cycle λ of the clock signal OSC, wherein the number 14 corresponds to 0110, the stored register values. The cycle time of the refresh activation signal ACT is obtained as follows.

The stored register values, 0110 in the example shown, are compared to the frequency division signals ×4, ×8, ×16, and ×32, respectively, with the ×2 frequency division signal being treated as a default. Thus, the register value actually represents the first four digits of a five digit binary number, with the last digit being "0," i.e., "0110" actually corresponds to "01100," or a value of 12λ. This is then added to the width of the ACT signal, i.e., 2λ in the preferred embodiment, to obtain the cycle time of 14λ. However, singe the equivalent register value can range from "00000" to "11110," i.e., 0 to 30, the final cycle time of 2λ to 30λ.

In alternate embodiments, a fifth register could be used to correspond to the ×2 frequency division signal, and the width of the ACT signal would preferably be set to 1λ. In this case, the expanded register value could range from "00000" to "11111," i.e., 0 to 31, the final cycle time of 1λ to 32λ.

Therefore, the refresh activation signal ACT is set to have one among the 16 cycles, namely, 2λ, 4λ, 6λ , . . . , and 32λ according to the values stored in the registers 31, 32, 33, and 34. In the present embodiment, an example where four registers 31, 32, 33, and 34 exist is described. However, if five registers were used, the refresh activation signal ACT could be set to have one among the 32 cycles, namely, 1λ, 2λ, 3λ , . . . , and 32λ.

Thus, the present invention can allow various refresh cycles, 1λ, 2λ, 3λ , . . . , and 32λ, to be selected according to the values stored in the registers in this invention. Furthermore, this invention uses the frequency division signals ×2, ×4, ×8, ×16, and ×32, which are generated by multiplying the clock cycle λ by powers of two, and are used as the refresh cycles in the conventional technology. Therefore it is possible to control the refresh cycle.

An example of controlling the refresh cycle of the refresh activation signal of the present invention has been described above. The example is for setting a specific refresh cycle for the refresh operation in a counter circuit having a counter signal with a predetermined division rate with respect to the cycle of the clock signal received from the outside. It is apparent from the descriptions and examples above that the division rate can be controlled according to the values stored in a register that is built into the counter circuit.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A refresh counter circuit, comprising:
   a frequency divider circuit which receives a clock signal having a first clock period, and which generates a plurality of divided clock signals, wherein the divided clock signals have respectively different clock periods which are multiples of the first clock period;
   a register which stores a multi-bit value indicative of a division rate, wherein each bit of the multi-bit value corresponds to a different one of the divided clock signals;
   a plurality of first gate circuits which respectively compare the divided clock signals with the corresponding bits of the multi-bit value stored in the register; and
   a second gate circuit which logically combines outputs of the plurality of first gate circuits to output a refresh activation signal having a clock period which is a multiple of the first clock period.

2. The refresh counter circuit of claim 1, wherein the different clock periods of the divided clock signals are powers of two of the first clock clock period.

3. The refresh counter of claim 2, wherein the clock period of the refresh activation signal is selectable as any one of 2λ, 4λ, 6λ, ... or nλ, according to the multi-bit value stored in the register, where λ is the first clock period and n is an integer.

4. The refresh counter of claim 3, wherein n=32, and wherein a number of bits of the multi-bit value is 4.

5. The refresh counter of claim 2, wherein the clock period of the refresh activation signal is selectable as any one of 1λ, 2λ, 3λ, ... or nλ, according to the multi-bit value stored in the register, where λ is the first clock period and n is an integer.

6. The refresh counter of claim 5, wherein n=32, and wherein a number of bits of the multi-bit value is 5.

7. The refresh counter of claim 1, wherein the register comprises a plurality of fuses having on/off states which respectively define the multi-bit value indicative of the division rate.

8. The refresh counter of claim 1, wherein the register comprises a mode register set which stores the multi-bit value indicative of the division rate.

9. The refresh counter of claim 1, further comprising a reset circuit which disables and then re-enables the divider circuit in response to a reset signal.

10. A method for generating a refresh activation signal in a memory circuit, comprising:
    dividing a clock signal having a first clock period into a plurality of divided clock signals, wherein the divided clock signals have respectively different clock periods which are multiples of the first clock period;
    storing in a register a multi-bit value indicative of a division rate, wherein each bit of the multi-bit value corresponds to a different one of the divided clock signals;
    respectively comparing the divided clock signals with each corresponding bit of the multi-bit value stored in the register, and outputting a respective plurality of comparison signals; and
    logically combining the plurality of comparison signals to output a corresponding refresh activation signal having a clock period which is a multiple of the first clock period.

11. The method of claim 10, wherein the different clock periods of the divided clock signals are powers of two of the first clock period.

12. The method claim 11, wherein the clock period of the refresh activation signal is selectable as any one of 2λ, 4λ, 6λ, ... or nλ, according to the multi-bit value stored in the register, where λ is the first clock period and n is an integer.

13. The refresh counter of claim 12, wherein n=32, and wherein a number of bits of the multi-bit value is 4.

14. The refresh counter of claim 11, wherein the clock period of the refresh activation signal is selectable as any one of 1λ, 2λ, 3λ, ... or nλ, according to the multi-bit value stored in the register, where λ is the first clock period and n is an integer.

15. The refresh counter of claim 14, wherein n=32, and wherein a number of bits of the multi-bit value is 5.

16. The refresh counter of claim 10, wherein the multi-bit value is stored in the register by setting on/off states of a plurality of fuses contained in the register.

17. The refresh counter of claim 10, wherein the multi-bit value is stored in a mode register set of the register.

18. The refresh counter of claim 10, further comprising disabling and then re-enabling a divider circuit which divides the clock signal in response to a reset signal.

* * * * *